US007582955B2

(12) United States Patent
Saimen (10) Patent No.: US 7,582,955 B2
(45) Date of Patent: Sep. 1, 2009

(54) SEMICONDUCTOR DEVICE MANUFACTURING METHOD AND MANUFACTURING APPARATUS

(75) Inventor: Munehide Saimen, Sakata (JP)

(73) Assignee: Seiko Epson Corporation (JP)

( * ) Notice: Subject to any disclaimer, the term of this patent is extended or adjusted under 35 U.S.C. 154(b) by 84 days.

(21) Appl. No.: 11/998,357

(22) Filed: Nov. 29, 2007

(65) Prior Publication Data

US 2008/0090331 A1    Apr. 17, 2008

Related U.S. Application Data (62) Division of application No. 10/985,667, filed on Nov. 11, 2004, now Pat. No. 7,323,365.

(30) Foreign Application Priority Data

Nov. 14, 2003  (JP) .............................. 2003-385418

(51) Int. Cl.
*H01L 23/495* (2006.01)
(52) U.S. Cl. ......................... 257/668; 29/825
(58) Field of Classification Search ........................ None
See application file for complete search history.

(56) References Cited

FOREIGN PATENT DOCUMENTS

| JP | 09-312312 | 12/1997 |
|---|---|---|
| JP | WO 0048243 | 8/2000 |
| JP | 2002-261131 | 9/2002 |

OTHER PUBLICATIONS

Communication from Japanese Patent Office regarding related application.

*Primary Examiner*—Roy K Potter
(74) *Attorney, Agent, or Firm*—Harness, Dickey & Pierce, P.L.C.

(57) ABSTRACT

A method for manufacturing a semiconductor device is provided including: providing a reinforcing member on one surface of a wiring substrate that has a first region where a semiconductor chip is mounted and a second region around the first region, and has terminals extending from the first region to the second region formed on another surface thereof, in a manner that the reinforcing member overlaps the terminals and a part thereof protrudes from the first region to the second region; punching through from a surface side having the terminals in the wiring substrate, thereby cutting the terminals along a boundary between the first region and the second region; and punching through from the surface side having the reinforcing member in the wiring substrate, thereby continuously cutting the reinforcing member from an inboard side thereof to an outboard side along the boundary between the first region and the second region.

3 Claims, 6 Drawing Sheets

SEMICONDUCTOR DEVICE MANUFACTURING METHOD AND MANUFACTURING APPARATUS

CROSS-REFERENCE TO RELATED APPLICATIONS

This application is a divisional patent application of U.S. Ser. No. 10/985,667 filed Nov. 11, 2004, claiming priority to Japanese Patent Application No. 2003-385418 filed Nov. 14, 2003 all of which are hereby expressly incorporated by reference herein in their entirety.

BACKGROUND

1. Technical Field

The present invention relates to semiconductor device manufacturing methods and manufacturing apparatuses.

2. Related Technology

A reinforcing member is adhered to a wiring substrate in a COF (Chip On Film) device that is one form of a semiconductor device. The reinforcing member is to reinforce terminals of a wiring pattern, whereby the terminals can be inserted in a connector. The reinforcing member is attached to a wiring substrate, and then cut together with the wiring substrate in a predetermined shape.

Conventionally, the cutting step is conducted in a single process from one surface side of the wiring substrate. According to this, when a region of the terminals on the wiring substrate is cut, burs may be generated in a direction in which the terminals can be peeled. Or, when the reinforcing member is continuously cut from the inside thereof to the outside, cracks or indents may be generated in a region of the semiconductor device that becomes a final product. It has conventionally been difficult to solve these problems simultaneously.

It is an object of the present invention to improve the reliability concerning semiconductor device manufacturing methods and manufacturing apparatuses.

SUMMARY

A method for manufacturing a semiconductor device in accordance with the present invention includes the steps of:

(a) providing a reinforcing member on one surface of a wiring substrate that has a first region where a semiconductor chip is mounted and a second region around the first region, and has terminals extending from the first region to the second region formed on another surface thereof, in a manner that the reinforcing member overlaps the terminals and a part thereof protrudes from the first region to the second region;

(b) punching through from a surface side having the terminals in the wiring substrate, thereby cutting the terminals along a boundary between the first region and the second region; and (c) punching through from a surface side having the reinforcing member in the wiring substrate, thereby continuously cutting the reinforcing member from inside thereof to outside along the boundary between the first region and the second region.

According to the present invention, the step of cutting along the boundary between the first region and the second region is divided into the step of cutting the terminals and the step of continuously cutting the reinforcing member from the inside thereof to the outside, and then conducted. Accordingly, a process to prevent the terminals from peeling off and a process to prevent the first region from developing cracks can both be realized, and therefore the reliability of the semiconductor device can be improved.

In the method for manufacturing a semiconductor device, step (c) may be conducted after step (b) has been conducted.

In the method for manufacturing a semiconductor device, step (b) may be conducted after step (c) has been conducted.

In the method for manufacturing a semiconductor device, in step (b), the second region may be punched through in a state in which the first region is pressed to be fixed, thereby cutting the terminals.

Accordingly, the peeling of the terminals in the first region can be prevented, and therefore the reliability of the semiconductor device can be improved.

In the method for manufacturing a semiconductor device, in step (b), the punching may be conducted along the boundary between the first region and the second region in a slit shape.

Accordingly, for example, the later step (c) can be conducted without changing the external configuration of the wiring substrate.

In the method for manufacturing a semiconductor device, in step (c), the second region may be punched through in a state in which the first region is pressed to be fixed, thereby continuously cutting the reinforcing member from an inside thereof to the outside.

Accordingly, since the second region is punched through, cracks are not generated or restrained from being generated in the first region, and the reliability of the semiconductor device can be improved.

In the method for manufacturing a semiconductor device, in step (c), the punching may be conducted along the boundary between the first region and the second region in a slit shape.

Accordingly, for example, the later step (b) can be conducted without changing the external configuration of the wiring substrate.

In the method for manufacturing a semiconductor device, by steps (b) and (c), the cutting may be conducted along the entire boundary between the first region and the second region.

Accordingly, the first region can be cut into an individual piece.

In the method for manufacturing a semiconductor device, by steps (b) and (c), the cutting may be conducted along a part of the boundary between the first region and the second region.

Accordingly, the first region can be handled with the external configuration of the wiring substrate, and therefore the management of the semiconductor device becomes facilitated.

In the method for manufacturing a semiconductor device, the wiring substrate may have a plurality of first regions, the wiring substrate may span across a pair of first and second reels, and at least one of steps (b) and (c) may be conducted while the wiring substrate is fed out from the first reel and wound by the second reel.

In the method for manufacturing a semiconductor device, in step (a), the reinforcing member may be adhered to the wiring substrate through adhesive material.

In the method for manufacturing a semiconductor device, the adhesive material may be an energy setting type adhesive material, and the step of applying energy to harden the adhesive material may further be included before steps (b) and (c).

Accordingly, when the inside of the reinforcing member is cut, the adhesive material existing between the wiring substrate and the reinforcing member can be prevented from adhering to a cutting tool. Also, when the adhesive material has hardened, peeling of the reinforcing member from the wiring substrate can be prevented after the cutting steps.

In accordance with the present invention, an apparatus for manufacturing a semiconductor device including a wiring substrate having a first region where a semiconductor chip is mounted and a second region around the first region, and terminals extending from the first region to the second region formed on one surface thereof includes:

a cutting section that cuts the wiring substrate, wherein a reinforcing member is provided on another surface of the wiring substrate in a manner that the reinforcing member overlaps the terminals and a part thereof protrudes from the first region to the second region, and wherein the cutting section includes a first cutting section for cutting the terminals along the boundary between the first region and the second region by punching through from a surface side having the terminals in the wiring substrate, and a second cutting section for continuously cutting the reinforcing member from inside thereof to outside along the boundary between the first region and the second region by punching through from a surface side having the reinforcing member in the wiring substrate.

According to the present invention, the cutting section for cutting along the boundary between the first region and the second region is divided into the second cutting section for cutting the terminals and the first cutting section for continuously cutting the reinforcing member from the inside thereof to the outside. Accordingly, a process to prevent the terminals from peeling off and a process to prevent the first region from developing cracks can both be realized, and therefore the reliability of the semiconductor device can be improved.

In the apparatus for manufacturing a semiconductor device, the first cutting section may include a die for pressing the first region to be fixed, and a punch to punch through the second region.

Accordingly, peeling of the terminals in the first region can be prevented, such that the reliability of the semiconductor device can be improved.

In the apparatus for manufacturing a semiconductor device, the second cutting section may include a die for pressing the first region to be fixed, and a punch to punch through the second region.

Accordingly, the second region is punched through, and therefore cracks are not generated or restrained from being generated in the first region, such that the reliability of the semiconductor device can be improved.

DETAILED DESCRIPTION

Embodiments of the present invention are described below with reference to the accompanying drawings.

First Embodiment

Figure 1:
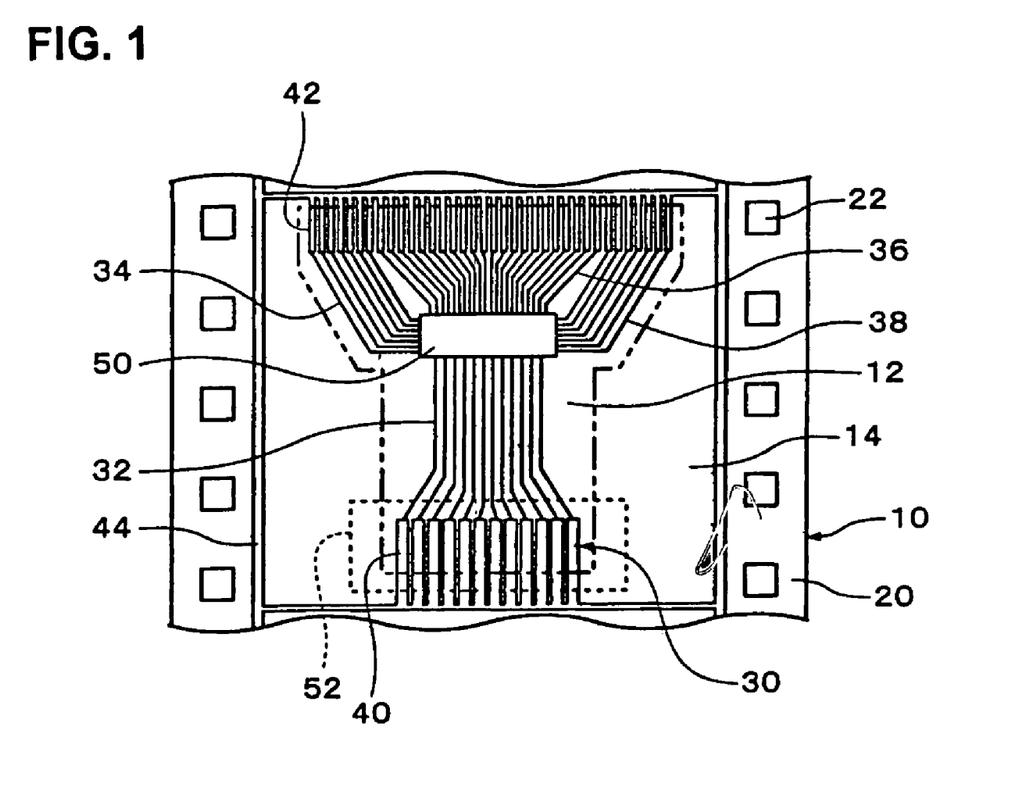
FIG. 1 is a view for describing a semiconductor device manufacturing method and manufacturing apparatus in accordance with a first embodiment of the present invention.
Figure 2:
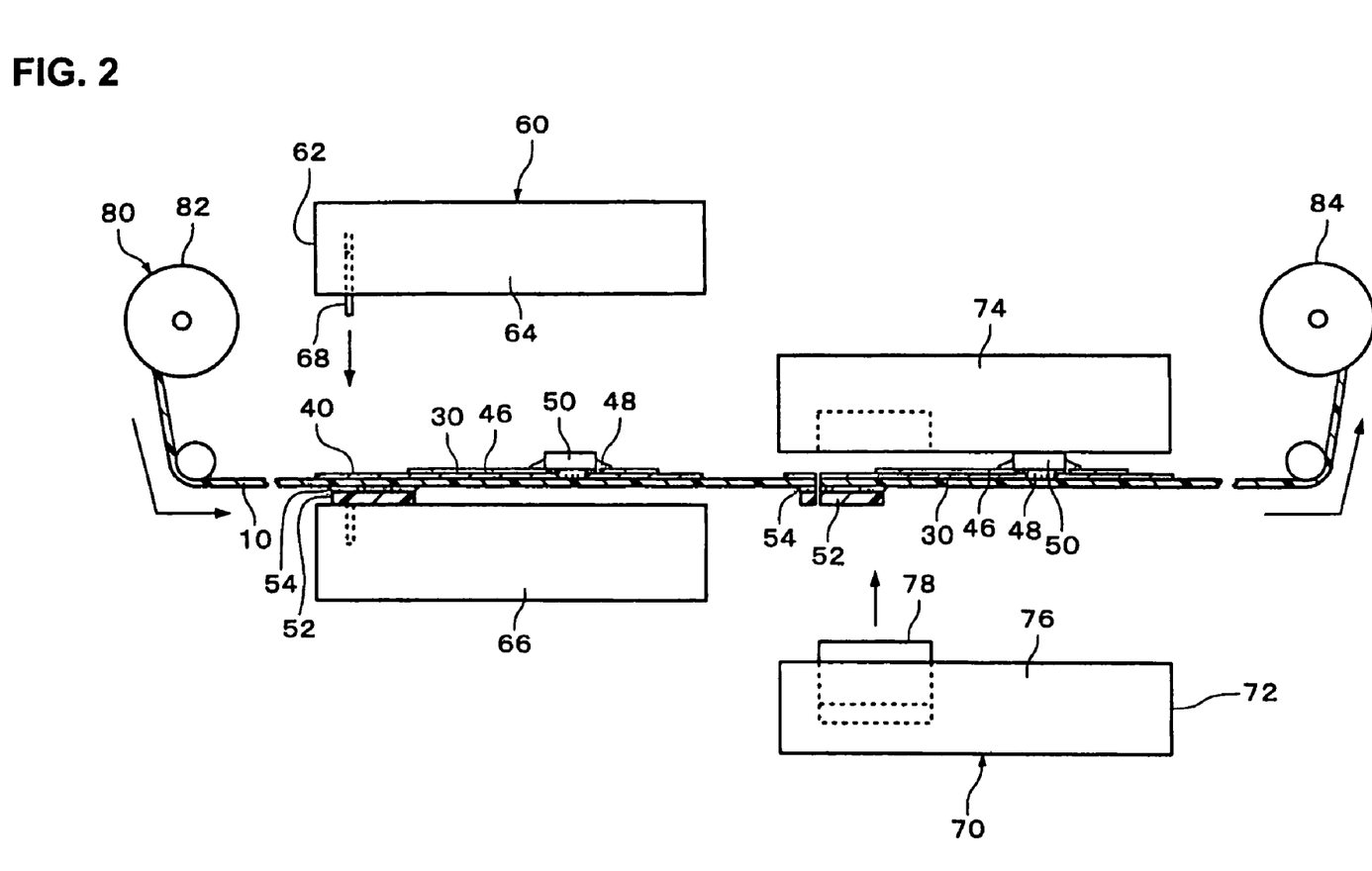
FIG. 2 is a view for describing a semiconductor device manufacturing method and manufacturing apparatus in accordance with the first embodiment of the present invention.
Figure 3:
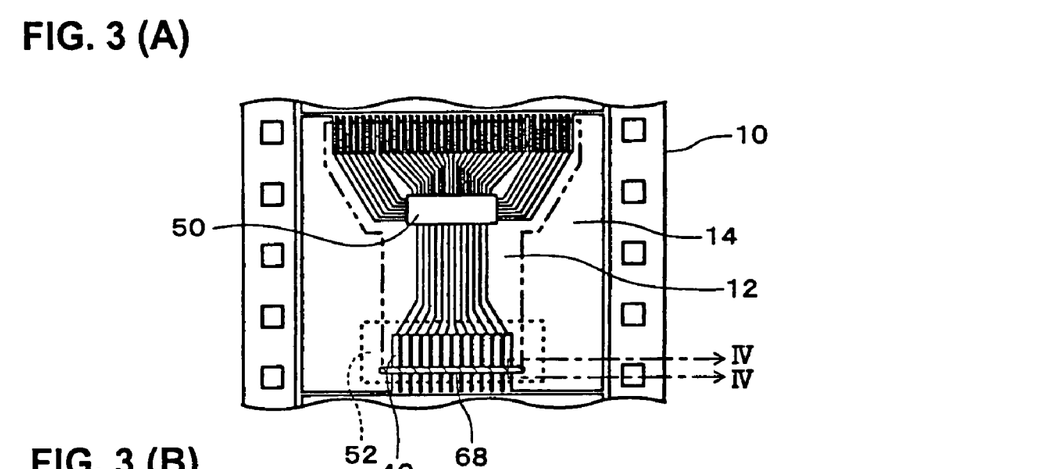
FIG. 3(A)-FIG. 3(C) are views for describing the semiconductor device manufacturing method and manufacturing apparatus in accordance with the first embodiment of the present invention.

FIG. 1-FIG. 4 are views for describing a semiconductor device manufacturing method and manufacturing apparatus in accordance with an embodiment of the present invention. FIG. 1 is a plan view of a wiring substrate used in the present embodiment, wherein a semiconductor chip is mounted on the wiring substrate. FIG. 2 is a diagram for describing the steps of cutting in a reel-to-reel transfer, wherein a cross-sectional view of the wiring substrate is shown. FIG. 3(A)-FIG. 3(C), and FIG. 4 are views for describing the steps of cutting the wiring substrate.

As shown in FIG. 1, the wiring substrate 10 includes a first region 12 (a region surrounded by a two-dot and dash line), and a second region 14 around the first region 12. The first region 12 has a plane configuration of a final product, and may be a region that cannot be visually recognized during the semiconductor device manufacturing stage. In the present embodiment, the wiring substrate 10 includes a plurality of the first regions 12. The plural first regions 12 may be arranged in a single column (in the up-down direction in FIG. 1, although omitted), or may be arranged in a plurality of rows and a plurality of columns. In the present embodiment, a COF (chip on film) type semiconductor device is manufactured.

As shown in FIG. 1, the wiring substrate 10 includes a base substrate 20 and a wiring pattern 30. The base substrate 20 is a film composed of insulation material, and supports the wiring pattern 30. The base substrate 20 may be a flexible substrate formed from an organic material (for example, resin). In the example shown in FIG. 1, the base substrate 20 is in an elongated shape, and includes a plurality of holes 22 along side sections thereof. The holes 22 can also be used for positioning.

The wiring pattern 30 is formed on one surface of the base substrate 20, and formed in the first region 12. The wiring pattern 30 can be formed in each of a plurality of the first regions 12. A part of the wiring pattern 30 (for instance, a part of first terminals 40 and a part of second terminals 42 to be described later) may be formed in the second region 14. The wiring pattern 30 is composed of an electroconductive material (for example, copper (Cu) or gold (Au)), and includes a plurality of wirings 32, 34, 36 and 38. The wirings 32-38 have one terminal ends that extend to a region for mounting a semiconductor chip 50 as terminals for connecting to the semiconductor chip. Other terminal ends of the wirings 32-38 define terminals of the semiconductor device for external connection (first and second terminals 40 and 42). In the example shown in FIG. 1, the wiring 32 has first terminals (for example, input terminals) 40, and the wirings 34-38 have second terminals (for example, output terminals) 42. The first terminals 40 may be wider than other portions of the wiring 32. As shown in FIG. 1, the plurality of the first terminals 40 are arranged linearly (in a parallel array) along a boundary (the two-dot and dash line in FIG. 1) between the first region 12 and the second region 14. The first terminals 40 extend from the first region 12 to the second region 14. The first terminals 40 may be connected to plating leads 44 formed for electroplating. The above is similarly applied to the second terminals 42. It is noted that the plating leads 44 pass through the second region 14, and are electrically connected to a plurality of wiring patterns 30.

As shown in FIG. 2, an insulation film (for example, solder resist) 46 may be formed on a surface of the wiring substrate 10 where the wiring pattern 30 is formed. The insulation film 46 covers the wiring pattern 30 while avoiding the semiconductor chip connecting terminals and the first and second terminals 40 and 42 for external connection described above.

The semiconductor chip 50 is mounted on the wiring substrate 10 in a manner to be electrically connected to the wiring pattern 30. The semiconductor chip 50 is a driver IC, and includes an integrated circuit formed inside. The semiconductor chip 50 may be, for example, face-down bonded to the first region 12. As shown in FIG. 2, an underfill material (resin) 48 is provided between the semiconductor chip 50 and the wiring substrate 10. It is noted that, although omitted in FIG. 1, other electronic components may be mounted on the wiring substrate 10.

First, a reinforcing member 52 is provided on a surface of the wiring substrate 10 (on the surface of the base substrate 20), which is on the opposite side of the wiring pattern 30 (at the first terminals 40). The reinforcing member 52 reinforces regions where terminals (for example, the first terminals 40) are formed in the wiring substrate 10 so that the terminals (for example, the first terminals 40) can be inserted in a connector. The reinforcing member 52 restricts bending of the wiring substrate 10. The reinforcing member 52 may be a substrate (for example, an organic substrate), and may have a thickness greater than the thickness of the base substrate 20. In the present embodiment, the reinforcing member 52 is provided in a manner to overlap the first terminals 40. In this case, the reinforcing member 52 is provided in a manner that a part thereof protrudes from the first region 12 to the second region 14. In the example shown in FIG. 1, the reinforcing member 52 is provided such that a part thereof protrudes from the first region 12 to the second region 14 in a direction in which the plural first terminals 40 are arranged. By so doing, when the boundary between the first region 12 and the second region 14 is cut, the widths of the wiring substrate 10 and the reinforcing member 52 can be matched, such that an accurate positioning of them with respect to a connector becomes possible. It is noted that the reinforcing member 52 may also be provided in a manner that a part thereof protrudes from the first region 12 to the second region 14 in a direction perpendicular to the arranging direction of the plural first terminals 40.

The reinforcing member 52 may be adhered to the wiring substrate 10 through adhesive material 54. The adhesive material 54 is provided on the entire surface of contacting portions between the wiring substrate 10 and the reinforcing member 52. As the adhesive material 54, an energy setting type adhesive material that exhibits adhesive strength by application of predetermined energy, and then hardens (looses its adhesive strength), may be used. The energy may be any one of heat, light, pressure and the like. As the adhesive material 54, for example, a thermosetting type adhesive material or an ultraviolet ray setting type adhesive material can be used. The main composition of the adhesive material 54 may often be resin, and can be in a paste state or a film state under room temperature.

When an energy setting type adhesive material is used, the adhesive material 54 may be hardened by applying predetermined energy before a cutting process to be described below. In this case, although the hardening reaction of the adhesive material 54 may preferably be completed, the cutting process may be conducted at least after the hardening reaction has started. As a result, when the inside of the reinforcing member 52 is cut, the adhesive material 54 that is present between the wiring substrate 10 and the reinforcing member 52 can be prevented from adhering to a cutting tool (for example, a die or a punch). Also, when the adhesive material 54 has hardened, peeling of the reinforcing member 52 from the wiring substrate 10 can be prevented after the cutting process.

As a modified example, a material that exhibits adhesive strength under room temperature (for example, a known double-stick tape) may be used as the adhesive material 54.

Next, the wiring substrate 10 and the reinforcing member 52 are cut along the boundary between the first region 12 and the second region 14. In the present embodiment, they are not cut along the entire boundary between the first region 12 and the second region 14, but cut along a part thereof. For example, they may be cut in a manner to surround the first terminals 40 (see FIG. 3(C)).

The present process is conducted by using a manufacturing apparatus shown in FIG. 2. The semiconductor device manufacturing apparatus includes a first cutting section 60, a second cutting section 70, and a transfer apparatus 80.

The first cutting section 60 cuts the first terminals 40 along the boundary between the first region 12 and the second region 14 (see FIG. 3(A)). The first cutting section 60 includes a first cutting tool 62. The first cutting tool 62 may be a shearing type (punch through type). More specifically, the first cutting tool 62 includes dies 64 and 66 for pressing the first region 12 to be fixed, and a punch 68 for punching through the second region 14. The dies 64 and 66 may additionally press parts of the second region 14 except the region to be punched through (peripheral regions of the punch 68 in FIG. 3(A)). The die 64 presses the wiring substrate 10 in a direction different from the die 66. The punch 68 is movable in an axial direction of holes of the dies 64 and 66, and can punch through the second region 14 of the wiring substrate 10 in one direction. In the present embodiment, the punch 68 is disposed above the surface of the wiring substrate 10 on the side of the first terminals 40, and can punch through from that surface side in a direction in which the wiring substrate 10 is penetrated. A tip surface (a surface that contacts the wiring substrate 10) of the punch 68 may be flat, and may tear at least a part of the wiring substrate 10 and the reinforcing member 52 to thereby form a torn surface.

The second cutting section 70 continuously cuts the reinforcing member 52 from the inside thereof to the outside along the boundary between the first region 12 and the second region 14 (see FIG. 3(B)). The second cutting section 70 includes a second cutting tool 72. The second cutting tool 72 may be a shearing type (punch through type). More specifically, the second cutting tool 72 includes dies 74 and 76 for pressing the second region 14 to be fixed, and a punch 78 for punching through the first region 12. The dies 74 and 76 may additionally press parts of the second region 14 except the region to be punched through (peripheral regions of the punch 78 in FIG. 3(B)). The die 74 presses the wiring substrate 10 in a direction different from the die 76. The punch 78 is movable in an axial direction of the holes of the dies 74 and 76, and can punch through the second region 14 of the wiring substrate 10 in one direction. In the present embodiment, the punch 78 is disposed above the surface of the wiring substrate 10 on the side of the reinforcing member 52, and can punch through from that surface side in a direction in which the wiring substrate 10 is penetrated. A tip surface (a surface that contacts the wiring substrate 10 or the reinforcing member 52) of the punch 78 may be flat, and may tear at least a part of the wiring substrate 10 and the reinforcing member 52 to form a torn surface.

The transfer apparatus 80 includes a pair of first and second reels 82 and 84. The wiring substrate 10 is spanned across the first and second reels 82 and 84, fed from the first reel 82 and wound on the second reel 84, thereby enabling a reel-to-reel transfer. In the present embodiment, the first and second cutting sections 60 and 70 may be disposed between the first and second reels 82 and 84, and the cutting steps may be conducted in a single transfer. In this case, the punch 68 of the first cutting section 60 is disposed on a surface side having the first terminals 40 in the wiring substrate 10, and the punch 78 of the second cutting section 70 is disposed on a surface side having the reinforcing member 52 of the wiring substrate 10. The first cutting section 60 may be disposed on an upstream side of the transfer direction with respect to the second cutting section 70. As a result, cutting by the first cutting section 60 can be conducted before cutting by the second cutting section 70. Alternatively, the second cutting section 70 may be disposed on an upstream side of the transfer direction with respect to the first cutting section 60. As a result, cutting by the second cutting section 70 can be conducted before cutting by the first cutting section 60. As a modified example, one of the first cutting section 60 and the second cutting section 70 may be disposed between the first and second reels 82 and 84, and the cutting steps may be conducted in a plurality of transfers. For example, when the punches 68 and 78 of the respective sections are disposed on the same side (for example, the upper side of the wiring substrate 10), after the cutting step by one of the cutting sections is completed, the front and back of the wiring substrate 10 may be reversed, and the cutting step by the other of the cutting sections may be conducted. It is noted that the transfer apparatus is not limited to any particular configuration, and can be, for example, a belt type conveyor, so long as it can transfer the wiring substrate 10 in a fixed direction.

Figure 4:
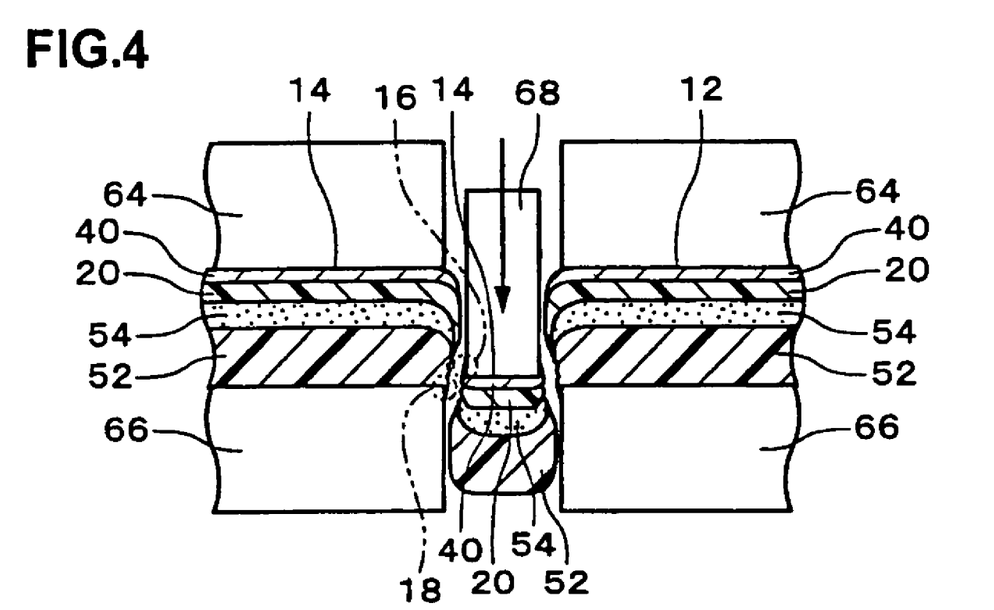
FIG. 4 is a cross-sectional view taken along a line IV-IV of FIG. 3(A).

As shown in FIG. 3(A), in the cutting step by the first cutting section 60, the first terminals 40 are cut by punching through the second region 14. At this time, at least the first region 12 is pressed to be fixed. In the present embodiment, it is punched through along the boundary between the first region 12 and the second region 14 in a slit shape (for example, in the shape of a long hole). As shown in FIG. 3(B), a slit 90 may be formed in the second region 14. In this case, as shown in FIG. 4, the second region 14 is also pressed to be fixed, and a portion in the second region 14 adjacent to the first region 12 is punched through. Because of the slit 90, the cutting step by the second cutting section 70 can be conducted without changing the external configuration of the wiring substrate 10.

In the present embodiment, the punch 68 pierces the wiring substrate 10 from the side of its surface where the first terminals 40 are provided. In this case, in portions that are punched through by the punch 68, burs 16 are formed on the side of the first terminals 40. On the other hand, in portions that are pressed by the dies 64 and 66, burs 18 are formed on the side of the reinforcing member 52. The burs 16 on the side of the first terminals 40 may promote peeling of the first terminals 40 from the base substrate 20, but the burs 18 on the side of the reinforcing member 52 do not cause such a problem. In accordance with the present embodiment, because the burs 16 on the side of the first terminals 40 are not formed in the first region 12 that is used as a final product, the first terminals 40 (the wiring pattern 30) are prevented from peeling off, such that the reliability of the semiconductor device can be improved.

As indicated in FIG. 3(B), the slit 90 may be a gap or a long hole, and may be formed linearly or curved. The slit 90 extends inside the reinforcing member 52 in a widthwise direction of the first terminals 40, and traverses the first terminals 40. As a modified example, the slit 90 may further include portions that extend inside the reinforcing member 52 in a lengthwise direction of the first terminals 40. In other words, the slit 90 may be formed in a U shape.

When the cutting step by the first cutting section 60 has been completed, the cutting step by the second cutting section 70 is conducted. As indicated in FIG. 2, the wiring substrate 10 may be transferred reel-to-reel, such that the work area may be transferred from the first cutting section 60 to the second cutting section 70, and the cutting step by the second cutting section 70 may be conducted.

As indicated in FIG. 3(B), in the cutting step by the second cutting section 70, the second region 14 is punched through, thereby continuously cutting the reinforcing member 52 from the inside thereof to the outside. In this instance, at least the first region 12 is pressed to be fixed. In accordance with the present embodiment, it is punched through along the boundary between the first region 12 and the second region 14 in a slit shape (for example, in the shape of a long hole). In this case, the second region 14 is also pressed to be fixed, and portions in the second region 14 adjacent to the first region 12 are punched through. The punch 78 punches in a manner that it overlaps a part (for example, an end section) of the slit 90 formed by the first cutting section 60.

In the present embodiment, the punch 78 punches through from a surface side of the wiring substrate 10 where the reinforcing member 52 is provided. In this case, in portions that are punched through by the punch 78, the wiring substrate 10 hangs onto the die 76 on the lower side (on the side of the punch 78) and bends due to the thickness of the reinforcing member 52. For this reason, at the cutting step, portions of the wiring substrate 10 may be excessively pulled, and cracks (or dents) may occur. On the other hand, in portions that are pressed by the dies 74 and 76, the wiring substrate 10 does not bend, and cracks are not generated. In the present embodiment, since the second region 14 is punched through, cracks are not generated or restrained from being generated in the first region 12 that is used as a final product, and therefore the reliability of the semiconductor device can be improved.

In this manner, as indicated in FIG. 3(C), a semiconductor device 1 (tape semiconductor device) can be manufactured. In the semiconductor device 1, a slit 92 is formed along the boundary between the first region 12 and the second region 14. The slit 92 includes a first portion 94 that extends inside the reinforcing member 52 along the widthwise direction of the first terminals 40, and a second portion 96 that extends continuously from the inside of the reinforcing member 52 to the outside and along the lengthwise direction of the first terminals 40. The first portion 94 traverses the first terminals 40. The second portion 96 may be formed in a manner to surround a region where the plural first terminals 40 are formed, and may be formed in one piece with the first portion 94. In the example shown in FIG. 3(C), the slit 90 corresponds to the first portion 94. The slit 92 is formed in the second region 14 along the boundary between the first region 12 and the second region 14.

In the present embodiment, the first region 12 and the second region 14 are connected at portions other than the slit 92. By so doing, the first region 12 can be handled with the external shape of the wiring substrate 10, such that management (such as shipping) of the semiconductor device is facilitated. It is noted that the semiconductor device 1 is finally cut out along the entire boundary between the first region 12 and the second region 14.

In accordance with the present embodiment, the step of cutting along the boundary between the first region 12 and the second region 14 is divided into the step of cutting the first terminals 40, and the step of continuously cutting the reinforcing member 52 from the inside thereof to the outside, and then conducted. Accordingly, the process to prevent peeling of the first terminals 40 and the process to prevent cracks in the first region 12 can both be realized, and the reliability of the semiconductor device can be improved.

Second Embodiment

Figure 5:
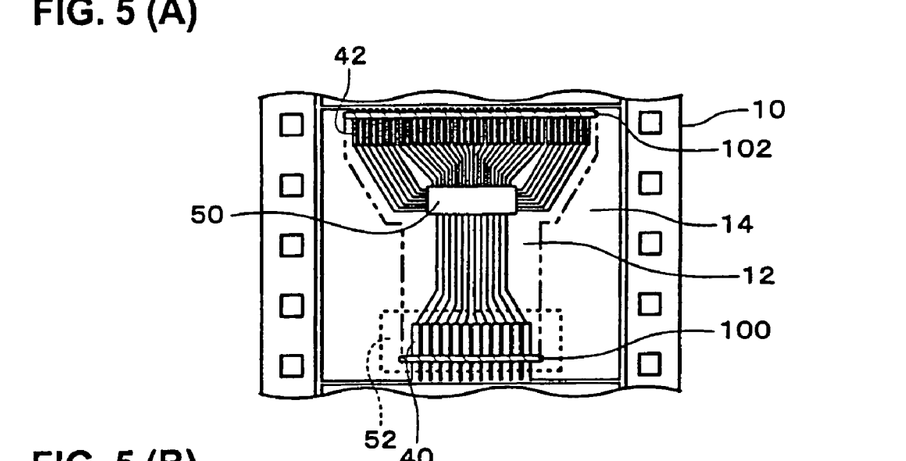
FIG. 5(A) and FIG. 5(B) are views for describing a semiconductor device manufacturing method and manufacturing apparatus in accordance with a second embodiment of the present invention.

FIG. 5(A) and FIG. 5(B) are views for describing a semiconductor device manufacturing method and manufacturing apparatus in accordance with a second embodiment of the present invention. In the present embodiment, after the step of attaching the reinforcing member 52 has been completed, the wiring substrate 10 and the reinforcing member 52 are cut along the entire boundary between the first region 12 and the second region 14. In the present embodiment, not only the first terminals 40, but also second terminals 42 are cut. It is noted that, in the present embodiment, a reinforcing member is not provided on the side of the second terminals 42.

As indicated in FIG. 5(A), in the cutting step by the first cutting section, all the terminals extending from the first region 12 to the second region 14 (the first and second terminals 40 and 42) among the wiring pattern are cut. Slits 110 and 112 may be formed in the second region 14 each by punching in a slit shape (for example, in the shape of a long hole) along the boundary between the first region 12 and the second region 14 (see FIG. 5(B)). The contents described above in the first embodiment can be applied to the details for the process. The punches 100 and 102 also punch through from the surface side having the first and second terminals 40 and 42 of the wiring substrate 10, as described above. In the example shown in FIG. 5(B), each of the slits 110 and 112 is formed in a linear shape. The aforementioned contents can also be applied to the slits 110 and 112. For example, the slit 110 corresponding to the first terminals 40 may be in the same configuration as that of the slit 90.

As indicated in FIG. 5(B), in the cutting step by the second cutting section, the second region 14 is punched through, thereby cutting along the entire boundary between the first region 12 and the second region 14. It is punched through in a slit shape (for example, in the shape of a long hole) along the boundary between the first region 12 and the second region 14. The contents of the first embodiment can be applied to the details for the process, and the punch 120 punches through from the surface side of the wiring substrate 10 where the reinforcing member 52 is provided, as described above. The punch 120 punches through in a manner that it overlaps portions (for example, end sections) of the respective slits 110 and 112 formed by the first cutting section. Other details of the process are the same as those described in the first embodiment.

In a manner described above, as shown in FIG. 5(C), a semiconductor device 3 (the first region 12) that is cut into an individual piece can be manufactured. The semiconductor device 3 is a final product. It is noted that, in the present embodiment, after the cutting step by the first cutting section has been completed, the cutting step by the second cutting section is conducted. As a modified example, the cutting step by the second cutting section may be conducted first, and then, the cutting step by the first cutting section may be conducted.

The contents described above in the aforementioned embodiments can be applied to other details of the present embodiment.

Figure 6:
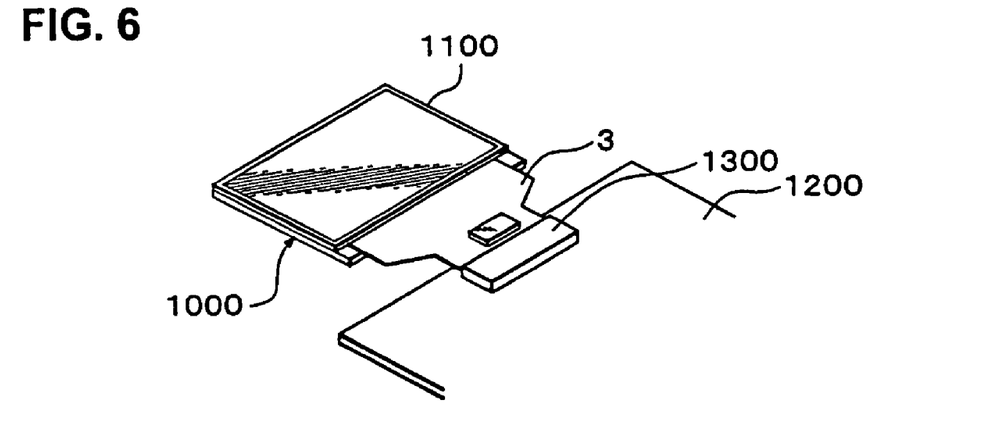
FIG. 6 is a view showing an electro-optic device in accordance with an embodiment of the present invention.

FIG. 6 is a view of an electro-optic device having a semiconductor device manufactured according to the present invention mounted thereon. The electro-optic device 1000 includes the semiconductor device 3 described above, an electro-optic panel (for example, a liquid crystal panel or an EL panel) 1100, and a circuit substrate (for example, a mother board) 1200. The semiconductor device 3 is electrically connected to the electro-optic panel 1100 through the second terminals (for example, output terminals), and electrically connected to the circuit substrate 1200 through the first terminals (for example, input terminals). The first terminals together with the reinforcing member are inserted in a connector 1300 of the circuit substrate 1200.

Figure 7:
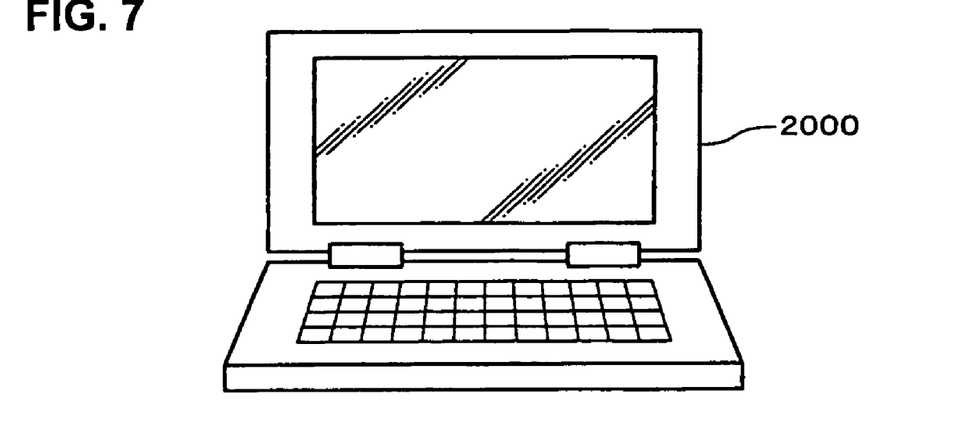
FIG. 7 is a view showing an electronic device in accordance with an embodiment of the present invention.
Figure 8:
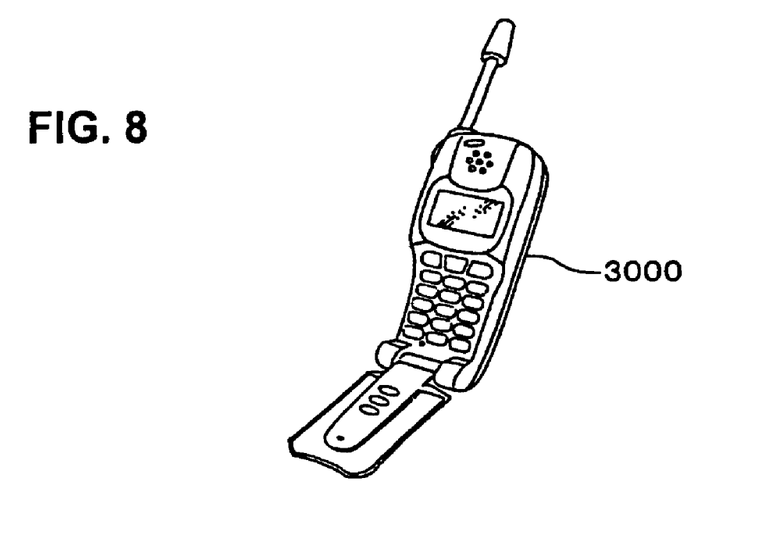
FIG. 8 is a view showing an electronic device in accordance with an embodiment of the present invention.

As electronic apparatuses having a semiconductor device manufactured in accordance with the present invention, FIG. 7 shows a notebook type personal computer 2000, and FIG. 8 shows a portable phone 3000.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that can achieve the same functions and effects or achieve the same objects of those of the compositions described in the embodiments. Furthermore, the present invention includes compositions that include publicly known technology added to the compositions described in the embodiments.

What is claimed is:

1. An apparatus for manufacturing a semiconductor device including a wiring substrate having a first region where a semiconductor chip is mounted and a second region around the first region, and terminals extending from the first region to the second region formed on one surface thereof, comprising:

a cutting section that cuts the wiring substrate;

wherein a reinforcing member is provided on another surface of the wiring substrate, the reinforcing member overlapping the terminals and a part of the reinforcing member protrudes from the first region to the second region; and wherein the cutting section includes:

a first cutting section cutting the terminals along a boundary between the first region and the second region by punching through from a surface side having the terminals in the wiring substrate; and a second cutting section continuously cutting the reinforcing member from an inboard side to an outboard side along the boundary between the first region and the second region by punching through from a surface side having the reinforcing member in the wiring substrate.

2. The apparatus for manufacturing a semiconductor device according to claim 1, wherein:

the first cutting section includes a die for pressing the first region to be fixed, and a punch to punch through the second region.

3. The apparatus for manufacturing a semiconductor device according to claim 1, wherein:

the second cutting section includes a die for pressing the first region to be fixed, and a punch to punch through the second region.

* * * * *